United States Patent
Chen et al.

(10) Patent No.: US 8,835,867 B2
(45) Date of Patent: Sep. 16, 2014

(54) MULTI-AXIS MAGNETIC LENS FOR FOCUSING A PLURALITY OF CHARGED PARTICLE BEAMS

(71) Applicant: Hermes-Microvision, Inc., Hsinchu (TW)

(72) Inventors: Zhongwei Chen, San Jose, CA (US); Weiming Ren, San Jose, CA (US); Xuedong Liu, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 0 days.

(21) Appl. No.: 13/741,654

(22) Filed: Jan. 15, 2013

(65) Prior Publication Data

US 2013/0181138 A1    Jul. 18, 2013

Related U.S. Application Data

(60) Provisional application No. 61/587,227, filed on Jan. 17, 2012.

(51) Int. Cl.
*H01J 3/14* (2006.01)
*H01J 3/26* (2006.01)
*H01J 49/42* (2006.01)

(52) U.S. Cl.
USPC .............. 250/396 R; 250/396 ML; 250/398; 250/310; 250/311; 250/492.2

(58) Field of Classification Search
USPC .............. 250/396 R, 396 ML, 398, 310, 311, 250/492.2
See application file for complete search history.

(56) References Cited

U.S. PATENT DOCUMENTS

| | | | | |
|---|---|---|---|---|
| 6,787,780 | B2* | 9/2004 | Hamaguchi et al. | 250/398 |
| 8,003,853 | B2* | 8/2011 | Meesapyodsuk et al. | 800/298 |
| 8,003,953 | B2* | 8/2011 | Chen et al. | 250/396 ML |
| 8,294,095 | B2* | 10/2012 | Chen et al. | 250/310 |
| 8,445,862 | B2* | 5/2013 | Chen et al. | 250/396 ML |
| 2011/0148297 | A1* | 6/2011 | Yasuda et al. | 315/5.35 |
| 2013/0248730 | A1* | 9/2013 | Ren et al. | 250/396 ML |

* cited by examiner

*Primary Examiner* — Jack Berman
*Assistant Examiner* — Meenakshi Sahu
(74) *Attorney, Agent, or Firm* — WPAT, PC; Justin King

(57) ABSTRACT

A cellular-type PD unit is proposed and a plurality of the cellular-type PD units is used in pairs in a multi-axis magnetic lens for focusing a plurality of charged beams. First type PD units or second type PD units (called as hybrid PD unit as well) can be applied to cellular-type PD units to flexibly construct sub-lenses. Furthermore, magnetic shielding plates with a plurality of through openings can be placed above and/or below the multi-axis magnetic lens to make magnetic flux leaking out of the multi-axis magnetic lens vanish away rapidly outside the magnetic shielding plates.

29 Claims, 12 Drawing Sheets

A-A Section

A-A Section

B-B Section

MULTI-AXIS MAGNETIC LENS FOR FOCUSING A PLURALITY OF CHARGED PARTICLE BEAMS

CLAIM OF PRIORITY

This application claims the benefit of priority of U.S. provisional application No. 61/587,227 entitled to inventors filed Jan. 17, 2012 and entitled "Multi-axis Magnetic Lens for Focusing a Plurality of Charged Particle Beams", the entire disclosures of which are incorporated herein by reference.

CROSS REFERENCE TO RELATED APPLICATIONS

This application is related to U.S. application Ser. No. 12/968,221 entitled to Chen et al. filed Dec. 14, 2010 and entitled "APPARATUS OF PLURAL CHARGED PARTICLE BEAMS WITH MULTI-AXIS MAGNETIC LENS", now U.S. Pat. No. 8,294,095, the entire disclosures of which are incorporated herein by reference.

This application is related to co-pending U.S. application Ser. No. 12/968,201 entitled to Chen et al. filed Dec. 14, 2010 and entitled "APPARATUS OF PLURAL CHARGED PARTICLE BEAMS WITH MULTI-AXIS MAGNETIC LENS", the entire disclosures of which are incorporated herein by reference.

This application is also related to U.S. provisional application No. 61/577,888 entitled to Ren et al. filed Dec. 20, 2011 and entitled "Multi-axis Magnetic Lens for focusing a Plurality of Charged Particle Beams", the entire disclosures of which are incorporated herein by reference.

BACKGROUND OF THE INVENTION

1. Field of the Invention

The present invention relates to a multi-axis magnetic lens and variants thereof used for focusing a plurality of charged particle beams individually and in parallel. More particularly, it relates to a multi-axis magnetic lens acting as an objective lens or a condenser lens or a transfer lens in a multi-beam apparatus which uses a plurality of electron beams to in parallel expose patterns onto or inspect defects on a wafer or mask in semiconductor manufacturing industry.

2. Description of the Prior Art

In semiconductor manufacturing industry, using an electron beam to expose patterns onto or inspect defects on a wafer or a mask has been a powerful method when critical feature dimensions of patterns or defects are beyond the competent ability of a photon beam. The reason is that an electron beam can offer superior spatial resolution compared to a photon beam due to its short wavelength. However, such a superior spatial resolution will be fundamentally deteriorated by electron interaction or called as Coulomb Effect as the electron beam current is increased to obtain a throughput competent for mass production.

To mitigate the limitation on throughput, many years ago it was proposed to use a plurality of electron beams each having a small current to expose patterns onto a wafer in parallel, instead of using one electron beam with a large current, such as in U.S. Pat. No. 3,715,580. For structuring a multi-beam apparatus using a plurality of electron beams, one critical problem is how to separately focus multiple electron beams individually and in parallel. Configuring multiple single-beam columns (MSCs) into one multi-beam apparatus is one solution naturally thought out at first. Because the spatial interval between every two adjacent beams must be large enough to physically accommodate two single-beam columns in parallel, the number of electron beams available for a wafer or a mask is not sufficient for mass production. As an alternate to use the MSCs, configuring a multi-axis lens to individually focus multiple electron beams in parallel is a promising way for using more electron beams. A multi-axis lens can reduce the beam interval by 50%, thereby almost doubling the apparatus throughput. Consequently, a multi-beam apparatus using a multi-axis lens can obtain a much higher throughput without degrading spatial resolution in comparison with using MSCs.

In U.S. Pat. No. 3,715,580, Maekawa et al. propose a multi-axis magnetic lens for throughput improvement of an IC pattern exposure system. FIG. 1A and FIG. 1B schematically show one embodiment of the multi-axis magnetic lens by a sectional view and a top view. In FIG. 1A, the multi-axis lens 100 comprises a common excitation coil 44, one yoke 43 and a pair of parallel magnetic conductor plates 41 and 42 with a plurality of through round holes in pairs therein. Each paired through round holes respectively in plates 41 and 42 are aligned with each other and have a common central axis, for example the paired holes H1 and h1 and the common central axis A1 thereof. When an electric current is exerted into the coil 44, a magnetic round-lens field will be generated between each paired holes. By this means, many magnetic sub-lenses can be formed in one multi-axis magnetic lens, such as S1, S2 and S3. For each sub-lens, the portions of plates 41 and 42, respectively forming the paired holes, are two pole-pieces of the sub-lens. Each magnetic sub-lens has an optical axis coincident with the common central axis of paired holes thereof and can focus an electron beam entering the sub-lens along the optical axis, such as beam B3 along the optical axis A3 of the sub-lens S3.

In the foregoing multi-axis magnetic lens, the magnetic flux leakage between each paired holes depends on the positions thereof on plates 41 and 42, geometrical shapes and magnetic permeability of plates 41 and 42, and the distribution of all the holes on plates 41 and 42. Hence, the magnetic fields of all the sub-lenses are fundamentally not a pure round-lens field and different from each other in distribution pattern and strength, no matter the shapes of plates 41 and 42 are circular as shown in FIG. 1B or not. Consequently, there are two inherent issues which hinder all the electron beams to obtain superior resolutions similar to that of a single beam focused by a single-axis lens which is fundamentally axisymmetric.

The first issue is a non-axisymmetry of the magnetic field in each sub-lens. The magnetic field distribution of each sub-lens degenerates from axial symmetry to a rotation symmetry and/or n-fold symmetry. In terms of Fourier analysis, the magnetic field comprises not only an axisymmetric component or called as round-lens field, but also a lot of non-axisymmetric transverse field components or called as high order harmonics, such as dipole field and quadrupole field. Only the round-lens field is necessary for focusing an electron beam, and the other components are undesired due to their impairment on beam focusing. The dipole field deflects the charged particle beam, thereby making the beam land on the image plane with position error, additional tilt angle and deflection aberrations. The quadrupole field adds astigmatism to the beam focusing. To compensate the influence of each high order harmonic, at least one additional element generating the same type field is required for each electron beam.

The second issue is the focusing power differences among all the sub-lenses if all the through round holes are same in geometry. The round-lens fields of all the sub-lenses are not equal to each other due to the differences in magnetic flux leakage. The sub-lens closer to the geometrical center of the plates 41 and 42 has a weaker round-lens field. For instance, compared with the sub-lenses S1 and S3, the sub-lens S2 has a weaker round-lens field. Due to the round-lens field difference, the beams B1, B2 and B3 respectively passing through the sub-lens S1, S2 and S3 are not focused onto a same image plane.

Many scientists propose methods to fundamentally mitigate or even eliminate the two issues per se. In U.S. Pat. No. 6,750,455, Lo et al. use a plurality of dummy holes to improve the local structure symmetry of each sub-lens. However this method makes the multi-axis magnetic lens system bulky. In U.S. Pat. No. 8,003,953, Chen et al. form a permeability-discontinuity (simply expressed as PD hereafter) unit inside each hole of every sub-lens to eliminate non-axisymmetric transverse field components inside every sub-lens and the focusing power differences among all the sub-lenses. For the sake of clarity, the foregoing unit is named as the first-type PD unit hereafter. A first-type PD unit comprises at least one non-magnetic annular layer and at least one magnetic annular layer all in alternate arrangement, and one of the magnetic annular layers is innermost. Inside a first-type PD unit, a magnetic annular layer is immediately enclosed by a non-magnetic annular layer and/or immediately encloses a non-magnetic annular layer so that permeability spatially alternates between 1 and much higher than 1 at least one time from the outermost layer to the innermost layer. Inside every hole where a first-type PD unit is formed, the outermost layer thereof adjoins the inner sidewall of the hole, and the innermost magnetic annular layer becomes a pole-piece instead of the portion forming the hole. The spatial alternation of permeability between 1 and much higher than 1 increases axial symmetry of the scale potential distribution inside the inner hole of the innermost magnetic annular layer and consequently reduces non-axisymmetric transverse field components of the sub-lens field.

FIG. 2A takes the sub-lens S3 as an example to show a simple embodiment of first-type PD formed inside the hole H3 in the upper magnetic conductor plate 41. One magnetic ring R3 with high permeability is inserted into the hole H3 with a non-magnetic radial gap G3 so as to form a first-type PD therein. The gap G3 is either a vacuum space, or filled with a non-magnetic material. Inside the first-type PD unit, permeability increases from 1 to permeability uR3 of the magnetic ring R3. The magnetic ring R3 is preferred to fully cover the sidewall of the hole H3, as shown in FIG. 2B. FIG. 2C further shows two first-type PD units respectively inside the paired holes H3 and h3 of the sub-lens S3. The two magnetic rings R3 and r3 of the two units become two pole-pieces and are aligned with each other to have a common central axis Z3. A magnetic field along the axis Z3 is generated through the non-magnetic gap between these two pole-pieces R3 and r3, and the axis Z3 becomes the optical axis of the sub-lens S3. One of two pole-pieces can be extended into the inner hole of the other pole-pieces so as to eliminate the non-axisymmetric transverse field components in the axial gap between two pole-pieces. The thicknesses of gaps G3 and g3 are small enough to keep a sufficient magnetic coupling for making the round-lens field strong enough, and large enough to minimize non-axisymmetric transverse field components to a negligible level inside the inner holes O3 and o3 of the two pole-pieces R3 and r3 respectively. In such a way, the non-axisymmetric transverse field components in the areas inside each sub-lens are reduced to a level much lower than that in FIG. 1A. The round-lens field differences or called as focusing power differences among all the sub-lenses are eliminated by appropriately choosing thickness differences of non-magnetic layers of first-type PD units.

Accordingly, Chen et al. employ a plurality of first-type units to form a multi-axis magnetic immersion objective in two patent applications list in the cross-reference, which comprises a plurality of immersion objective sub-lenses so that a plurality of charged particle beams can be individually and in parallel focused onto a specimen surface with small aberrations. Next, in the provisional application list in the cross-reference, Ren et al. simplify a foregoing multi-axis magnetic immersion objective in structure and generalize a first-type PD unit in material and constitution. Each sub-lens of the simplified multi-axis magnetic immersion objective has only one first-type unit rather than two. For generalizing a first-type PD unit in material, all or some of the non-magnetic layers can respectively be replaced by a weakly-magnetic layer, and thereby forming a second-type PD unit or a hybrid-type PD unit. For generalizing a first-type PD unit in constitution, one or more layers can have sub-layers. Each of the foregoing ways can make a multi-axis magnetic lens easier and more flexible in manufacturing.

SUMMARY OF THE INVENTION

On the basis of the fundamental of U.S. Pat. No. 8,003,953 and the cross-reference, the object of this invention is to generalize a first-type PD unit in structure so as to make a multi-axis magnetic lens easier in manufacturing and accommodate more sub-lenses without increasing the size thereof.

Initially, a cellular-type PD unit is proposed, which is different from a first-type or second-type (or hybrid-type) PD unit in the innermost magnetic layer which is cellular rather than annular. The magnetic cellular layer is a magnetic pillar with more than one through bores. Next, an annular magnetic layer or even a first-type or second-type (or hybrid-type) PD unit can be inserted inside each through bore of the magnetic cellular layer. Then, a plurality of paired cellular-type PD units is used to configure several types of multi-axis magnetic lens, wherein each paired cellular-type PD units form a sub-lens group comprising more than one sub-lenses.

Accordingly, the invention therefore provides a cellular-type PD unit, which comprises one magnetic cellular layer, and at least one non-magnetic or weakly-magnetic annular layer outside said magnetic cellular layer, wherein permeability of each weakly-magnetic annular layer is much smaller than that of said magnetic cellular layer. That any non-magnetic or weakly-magnetic annular layer can further comprise more than one non-magnetic or weakly-magnetic sub-layers.

This invention also provides another cellular-type PD unit, which comprises one magnetic cellular layer, at least one magnetic annular layer, and at least one non-magnetic or weakly-magnetic annular layer, wherein one magnetic annular layer is immediately enclosed by one non-magnetic or weakly-magnetic annular layer and/or immediately encloses one non-magnetic or weakly-magnetic annular layer, the innermost annular layer encloses said magnetic cellular layer, and permeability of each weakly-magnetic annular layer is much smaller than that of said magnetic cellular layer and magnetic annular layers. That any non-magnetic or weakly-magnetic annular layer can further comprise more than one non-magnetic or weakly-magnetic sub-layers and that any magnetic layer can further comprise more than one magnetic sub-layers.

The present invention therefore provides a multi-axis magnetic lens with a plurality of paired cellular-type PD units for focusing a plurality of charged particle beams individually and in parallel, which comprises a pair of parallel magnetic conductor plates with a plurality of through holes in pairs therein, a plurality of magnetic cellular pillars, and a common excitation coil. The pair of parallel magnetic conductor plates, with a plurality of through holes in pairs therein, includes an upper plate and a lower plate. For each paired through holes, an upper through hole in the upper plate is aligned with a corresponding lower through hole in the lower plate. The plurality of magnetic cellular pillars is in pairs inside the plurality of through holes with a plurality of first radial gaps in pairs respectively. Each pair of magnetic cellular pillars forms an axial gap therebetween and has a plurality of through bores in pairs therein. For each paired first radial gaps formed by each paired magnetic cellular pillars inside each paired through holes, a first upper radial gap is between an inner sidewall of the upper through hole and an outer sidewall of the upper magnetic cellular pillar inside the upper through hole, a first lower radial gap is between an inner sidewall of the lower through hole and an outer sidewall of the lower magnetic cellular pillar inside the lower through hole. For each paired through bores inside said each paired magnetic cellular pillars, an upper through bore in the upper magnetic cellular pillar is aligned with a corresponding lower through bore in the lower magnetic cellular pillar. A plurality of magnetic sub-lens group modules is therefore formed for focusing a plurality of charged particle beams respectively, wherein each magnetic sub-lens group comprises a plurality of magnetic sub-lenses, and paired upper and lower magnetic cellular pillars of each sub-lens group module respectively function as upper and lower pole-pieces of each sub-lens of said sub-lens group. The common excitation coil is located between the pair of parallel magnetic conductor plates for providing magnetic flux to the plurality of magnetic sub-lens group modules. Each paired through bores may be circular.

In this embodiment, each axial gap is vacuum or filled with non-magnetic material. Each first radial gap may be vacuum, or filled with non-magnetic or weakly-magnetic material, or comprise an annular multilayer therein. The annular multilayer may comprise non-magnetic or weakly-magnetic annular layers and magnetic annular layers in alternate arrangement.

The multi-axis magnetic lens may further comprise a plurality of first magnetic rings, wherein each first magnetic ring has an end adjacent to or inside one of said each paired through bores. A second radial gap may be formed between an outer sidewall of any first magnetic ring and an inner sidewall of the corresponding through bore if the first magnetic ring is inserted inside the through bore. The multi-axis magnetic lens may further comprise a plurality of second magnetic rings, wherein each second magnetic ring has an end adjacent to or inside the other of the each paired through bores. A third radial gap may be formed between an outer sidewall of any second magnetic ring and an inner sidewall of the corresponding through bore if the second magnetic ring is inserted inside the through bore. The second and the third radial gaps can respectively be vacuum, or filled with non-magnetic or weakly-magnetic material, or comprise an annular multilayer therein, wherein the annular multilayer may comprise non-magnetic or weakly-magnetic annular layers and magnetic annular layers in alternate arrangement.

In this embodiment, the multi-axis magnetic lens may further comprise at least one first magnetic shielding plate that is located on one side of the pair of magnetic conductor plates and respectively has a plurality of first through openings, wherein each paired through bores are aligned with one of the first through openings of each first magnetic shielding plate. The multi-axis magnetic lens may further comprise at least one second magnetic shielding plate that is located on the other side of the pair of magnetic conductor plates and respectively has a plurality of second through openings, wherein each paired through bores are aligned with one of the second through openings of each second magnetic shielding plate.

The present invention also provides a magnetic shielding device for a multi-axis magnetic lens, which comprises at least one first magnetic shielding plate respectively having a plurality of first through openings and on one side of the multi-axis magnetic lens, wherein an optical axis of each magnetic sub-lens of the multi-axis magnetic lens is aligned with one of the first through openings of each first magnetic shielding plate. All first magnetic shielding plates are configured to make magnetic flux leaking out of the multi-axis magnetic lens vanish away rapidly outside the magnetic shielding device. Each of the first magnetic shielding plates can be kept gaps from the others and the multi-axis magnetic lens so as to make magnetic flux leaking out of the multi-axis magnetic lens vanish away more rapidly outside the magnetic shielding device.

In this embodiment, the magnetic shielding device may further comprise at least one second magnetic shielding plate respectively having a plurality of second through openings and on the other side of the multi-axis magnetic lens, wherein the optical axis of each magnetic sub-lens of the multi-axis magnetic lens is aligned with one of the second through openings of each second magnetic shielding plate. All second magnetic shielding plates are configured to make magnetic flux leaking out of the multi-axis magnetic lens vanish away rapidly outside the magnetic shielding device. Each of the first and second magnetic shielding plates can be kept gaps from the others and the multi-axis magnetic lens so as to make magnetic flux leaking out of the multi-axis magnetic lens vanish away more rapidly outside the magnetic shielding device.

The present invention further provides a multi-axis magnetic lens, which comprises a pair of parallel magnetic conductor plates with a plurality of through holes in pairs therein, a plurality of magnetic pillars, and a common excitation coil. The pair of parallel magnetic conductor plates includes an upper plate and a lower plate, wherein for each paired through holes, an upper through hole in the upper plate is aligned with a corresponding lower through hole in the lower plate. The plurality of magnetic pillars is in pairs inside the plurality of through holes with a plurality of first radial gaps in pairs respectively. Each pair of magnetic pillars forms an axial gap therebetween and has a pair of bores, wherein for each paired first radial gaps formed by each paired magnetic pillars inside each paired through holes, a first upper radial gap is between an inner sidewall of the upper through hole and an outer sidewall of the upper magnetic pillar inside the upper through hole, a first lower radial gap is between an inner sidewall of the lower through hole and an outer sidewall of the lower magnetic pillar inside the lower through hole, wherein for one paired through bores inside said each paired magnetic pillars, an upper through bore in the upper magnetic pillar is aligned with a lower through bore in the lower magnetic pillar. A plurality of magnetic sub-lens modules is therefore formed for focusing a plurality of charged particle beams respectively, wherein paired upper and lower magnetic pillars of each sub-lens module respectively function as upper and lower pole-pieces of said sub-lens. The common excitation coil is located between the pair of parallel magnetic conductor plates for providing magnetic flux to the plurality of magnetic sub-lens modules. Each paired through bores can be circular.

In this embodiment, each axial gap is vacuum or filled with non-magnetic material. Each first radial gap can be vacuum, or filled with non-magnetic or weakly-magnetic material, or comprise an annular multilayer therein, wherein the annular multilayer may comprise non-magnetic or weakly-magnetic annular layers and magnetic annular layers in alternate arrangement. Any non-magnetic or weakly-magnetic annular layer can further comprise more than one non-magnetic or weakly-magnetic sub-layers, and any magnetic layer can further comprise more than one magnetic sub-layers.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which.

DETAILED DESCRIPTION OF EXAMPLE EMBODIMENTS

Figure 1A:
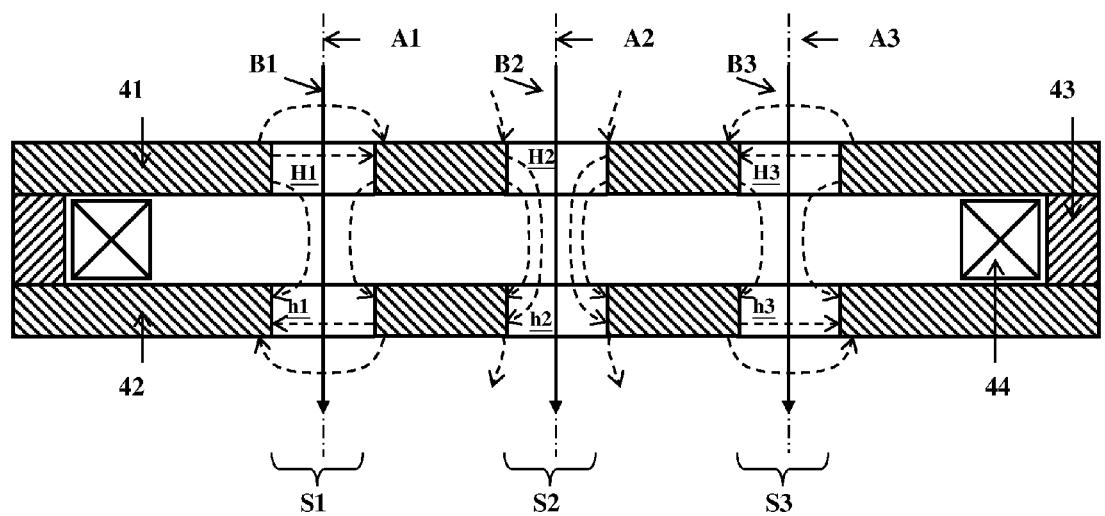
FIG. 1A and FIG. 1B are schematic illustrations of a conventional multi-axis magnetic lens.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

For the sake of clarity, detailed discussions on the embodiment features of the invention are based on a conventional multi-axis magnetic lens comprising three magnetic sub-lenses. However, it would be recognized that the number of sub-lenses are free to increase or decrease.

Similarly to the cross-reference, in this invention, "axial" means "in the optical axis direction of a sub-lens", while "radial" means "in a direction perpendicular to the optical axis of a sub-lens".

Figure 1B:
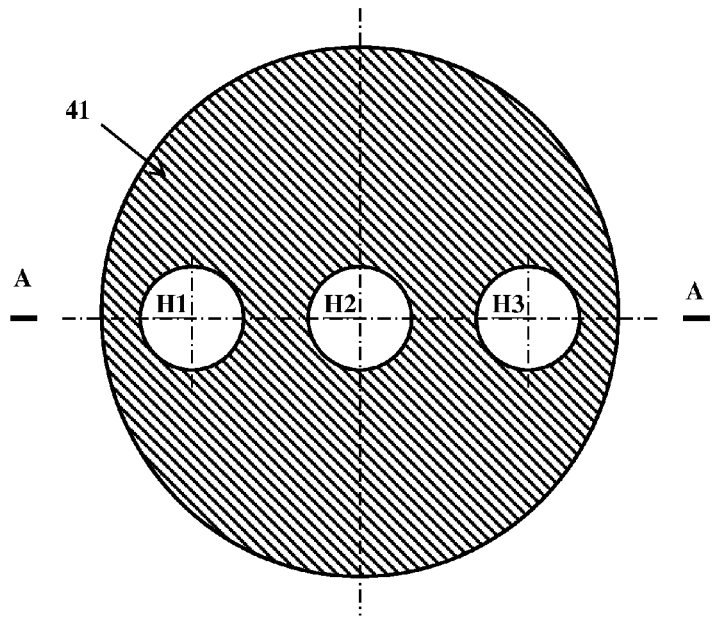

Similarly to the cross-reference, in this invention, every multi-axis magnetic lens has a basic configuration of a conventional multi-axis magnetic lens as shown in FIGS. 1A and 1B. Accordingly, all terms relate to through holes or openings mean holes or openings penetrated through one plate. Sometimes, especially through holes always refer to holes in a magnetic conductor plate, and openings always refer to holes in a magnetic shielding plate. "Paired through holes" means two coaxial through holes respectively in one of paired parallel magnetic conductor plates. Outlines or shapes of all openings and holes in this invention could be circular or non-circular.

Similarly to the cross-reference, in this invention, "a weakly-magnetic entity" has permeability much lower than that of all the surrounding magnetic entities.

In this invention, all terms relate to through bores mean holes penetrated through one plate and especially refer to holes in a magnetic pillar or a magnetic cellular layer. "Paired cellular-type PD units" mean two cellular-type PD units which are respectively inside one and the other of paired through holes and the innermost magnetic cellular layers thereof have a plurality of through bores in pairs. "Paired through bores" means two coaxial through bores respectively in one and the other of paired cellular-type PD units.

In this invention, "a sub-lens group" comprises all the sub-lenses configured by each paired cellular-type PD units.

A conventional multi-axis magnetic lens comprises a plurality of magnetic sub-lenses which inherently can not function equally and as well as an axisymmetric single-axis lens, no matter the shapes of the paired parallel magnetic conductor plates and each paired through holes therein are circular as shown in FIG. 1B or not. Therefore, it is proposed to insert one first-type (or second-type or hybrid-type) PD unit into each through hole of every sub-lens to make its performance approach an axisymmetric single-axis lens. A first-type PD unit is used to intentionally form a radial alternation of permeability between 1 (by the way, it is a little larger than 1 for a second-type or hybrid-type PD unit) and much higher than 1 inside a through hole so as to increases axial symmetry of the scale potential distribution in the area around the central axis thereof. Consequently, for the magnetic field of a sub-lens, an appropriate configuration of a first-type PD unit can not only efficiently eliminate the non-axisymmetric components, but also finely change the axisymmetric component (i.e. round-lens field or focusing power).

Figure 2A:
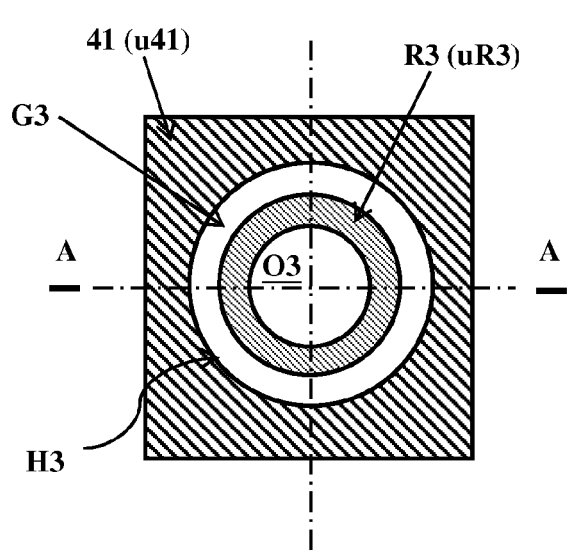
FIGS. 2A~2C are schematic illustrations of one magnetic sub-lens with two first-type PD units proposed in the prior art (U.S. Pat. No. 8,003,953).
Figure 2B:
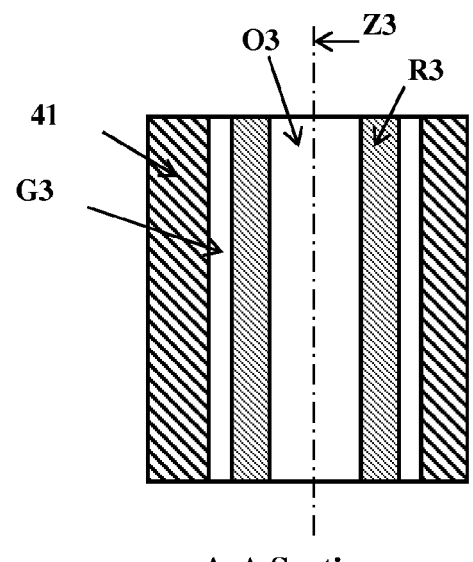

The innermost layer of a first-type (or second-type or hybrid-type) PD unit is an annular magnetic layer, such as R3 in FIG. 2A, and then the annular magnetic layer can only be one pole-piece of one sub-lens. To accommodate one first-type (or second-type or hybrid-type) PD inside, a through hole has to be enlarged enough. This may require a larger spatial interval between every two adjacent through holes, thereby reducing the number of electron beams available for a wafer or a mask.

Figure 3A:
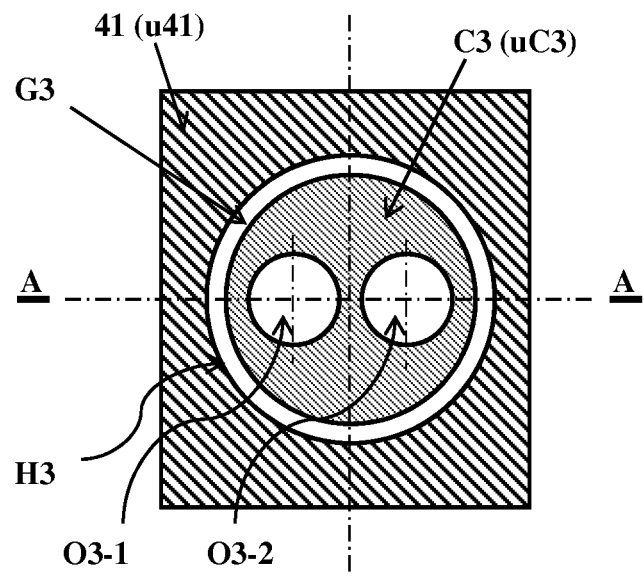
FIG. 3A and FIG. 3B are schematic illustrations of a cellular-type PD unit inserted inside a hole of a sub-lens in accordance with one embodiment of the present invention.
Figure 3B:
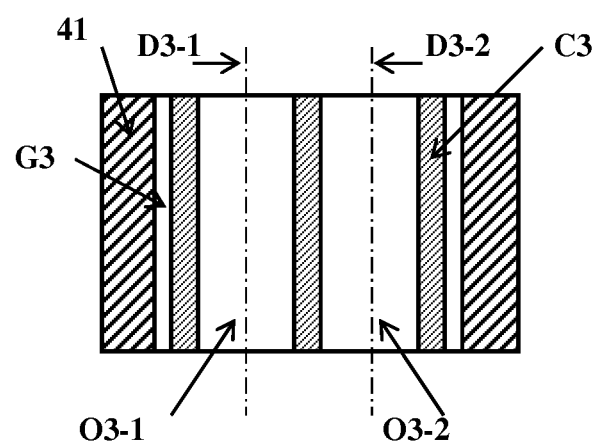

The present invention therefore provides a cellular-type PD unit, which has a configuration same as a first-type or second-type or hybrid-type PD unit except the innermost magnetic layer. The innermost magnetic layer of a cellular-type PD unit is cellular rather than annular, thereby in practice being a magnetic pillar with more than one through bores. Here the through hole H3 of sub-lens S3 in FIG. 1A is also take as an example to show how a cellular-type PD unit is formed and used. FIG. 3A shows one embodiment of a cellular-type PD unit inside the hole H3, which comprises a magnetic cellular pillar C3 and a radial gap G3 between the inner sidewall of the hole H3 and the outer sidewall of the pillar C3. The radial gap G3 needs to have permeability much lower than that of the magnetic pillar C3 and the magnetic conductor plate 41 both, and then it can be either a vacuum space, or filled with a non-magnetic or weakly-magnetic material. As shown in FIG. 3B, the magnetic pillar C3 has two through bores O3-1 and O3-2 and the central axes thereof are respectively D3-1 and D3-2. The radial alternation of permeability between 1 or a little larger than 1 and much higher than 1 inside a through hole greatly increases axial symmetry of the scale potential distribution in the area around the central axis of each through bore in the magnetic pillar C3.

Cellular-type PD units are used in pairs to match paired through holes. Paired Cellular-type PD units are respectively inside one and the other of paired through holes, and the innermost magnetic cellular layers thereof have a plurality of through bores in pairs. Paired through bores are respectively in one and the other of paired cellular-type PD units and are aligned to have a common central axis. A magnetic field will be generated through the non-magnetic gap between each paired through bores along the common central axis thereof. Fundamentally speaking, the field comprises one axisymmetric component or called as round-lens field and many non-axisymmetric transverse field components or called as high order harmonics. However, the improvement in axial symmetry of the scale potential distribution inside each bore efficiently reduces the high order harmonics to a negligible level and keeps the round-lens field strong enough. Therefore a sub-lens is formed by each paired through bores whose common central axis is the optical axis of the sub-lens, and a plurality of sub-lenses or called as a sub-lens group is formed by each paired cellular-type PD units inside each paired through holes in the paired magnetic conductor plates. Two innermost magnetic cellular layers of each paired cellular-type PD units become pole-pieces of a sub-lens group.

Figure 3C:
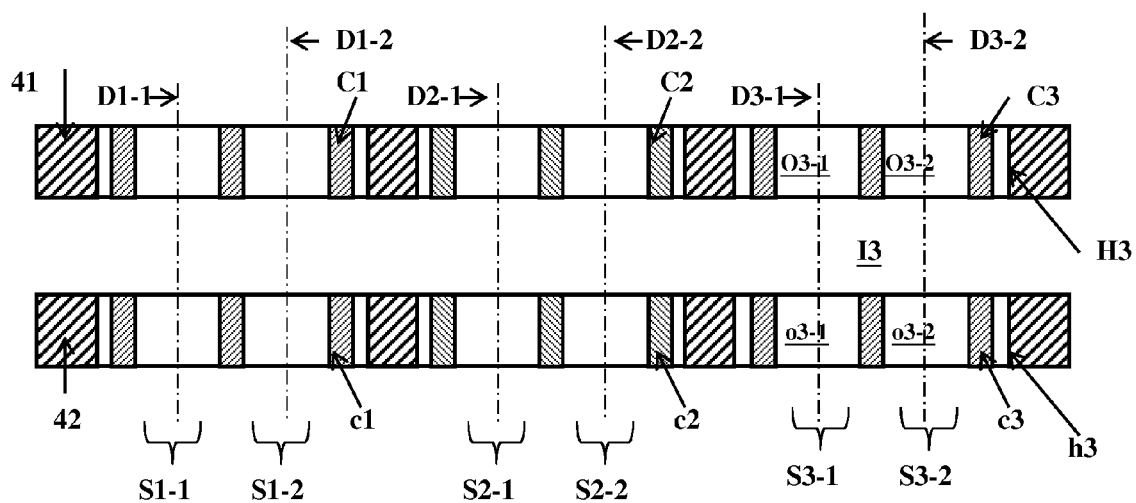
FIG. 3C and FIG. 3D are schematic illustrations of a multi-axis magnetic lens with a plurality of cellular-type PD units in accordance with the embodiment of the present invention shown in FIG. 3A and FIG. 3B.
Figure 3D:
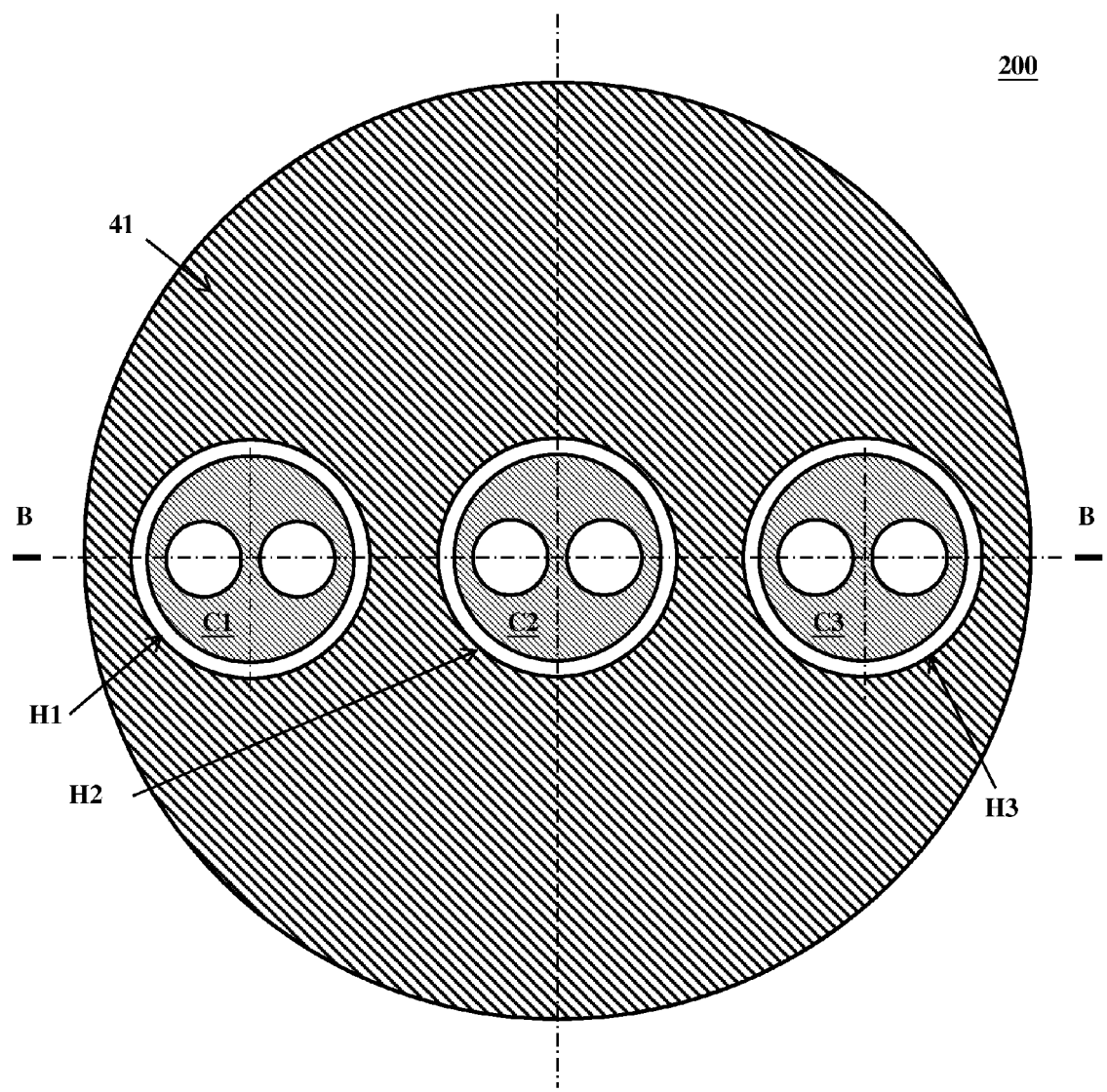

FIG. 3C and FIG. 3D schematically show one embodiment of a multi-axis magnetic lens with paired cellular-type PD units by a sectional view and a top view. In FIG. 3C and FIG. 3D, the multi-axis lens 200 has three paired through holes, and each of which accommodates one paired cellular-type PD units inside. Each paired cellular-type PD units have configurations same as the one shown in FIGS. 3A and 3B. Taking the paired cellular-type PD units inside the right paired through holes (H3 and h3) as an example, the magnetic cellular pillars C3 and c3 thereof form two paired through bores, O3-1 and o3-1, and O3-2 and o3-2. The two paired through bores respectively have a common central axis, D3-1 and D3-2. The gap 13 between two magnetic cellular pillars C3 and c3 are non-magnetic. Two magnetic round-lens fields will be generated through the gap 13 respectively along two common central axes D3-1 and D3-2. Therefore two sub-lenses S3-1 and S3-2 are formed inside the right paired through holes H3 and h3, instead of one sub-lens S3 as shown in FIG. 1A. The magnetic cellular pillar C3 and c3 become the upper and lower pole-pieces of the sub-lenses S3-1 and S3-2. The sub-lenses S3-1 and S3-2 form the sub-lens group. Although the outline of the multi-axis magnetic lens 200 is circular in FIG. 3D, it can be any other shapes. Similarly, although the shapes of all the through holes and the outlines of all the magnetic cellular pillars are circular in FIGS. 3A~3D, they can be non-circular.

Figure 4:
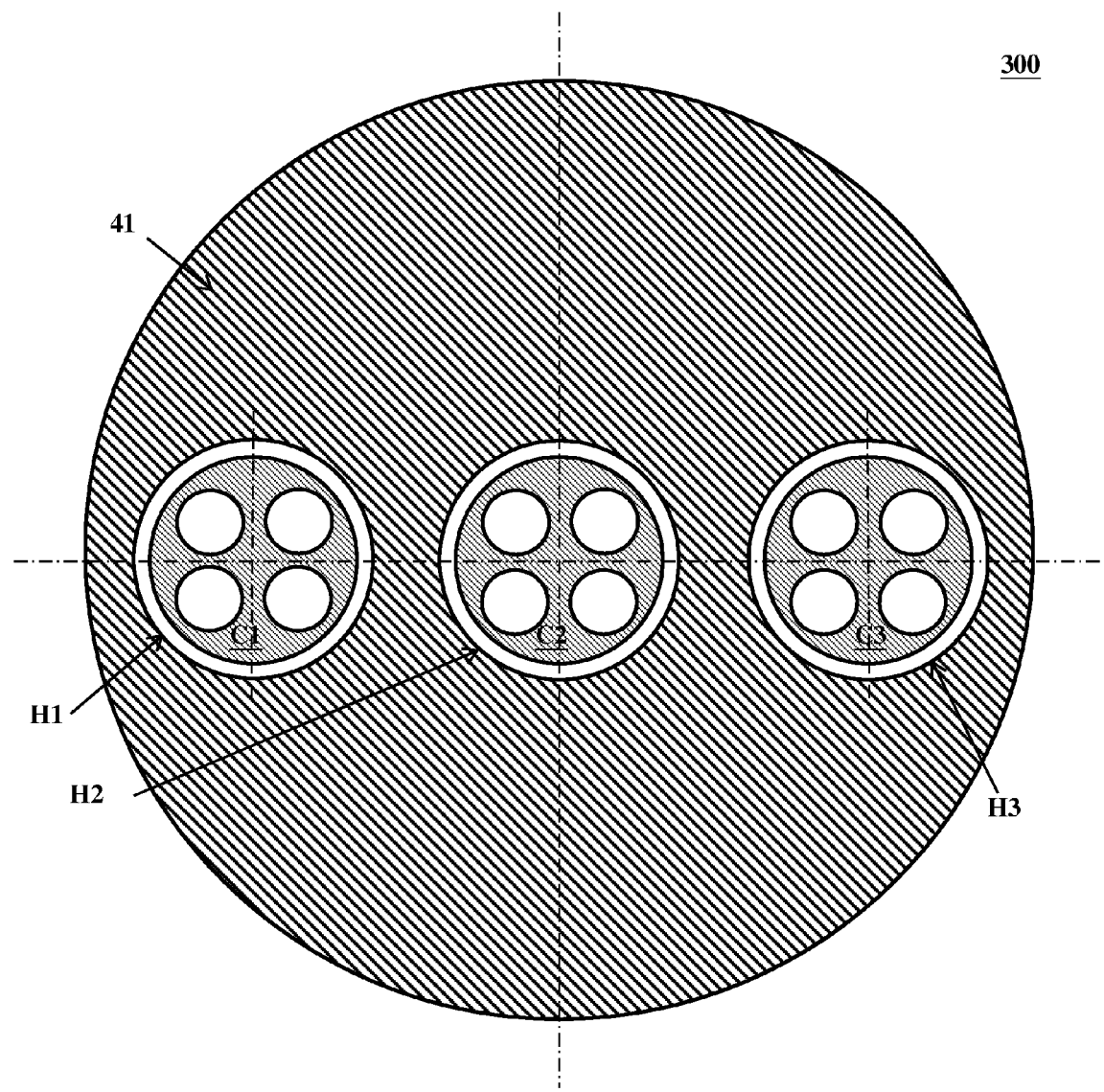
FIG. 4 is a schematic illustration of a top view of a multi-axis magnetic lens with a plurality of cellular-type PD units in accordance with another embodiment of the present invention.

Without limitation to FIG. 3A~3D, if it is necessary, one paired cellular-type PD units can be configured to form more than two sub-lenses in one paired through holes. FIG. 4 shows another embodiment of a multi-axis magnetic lens with paired cellular-type PD units by a top view, wherein the multi-axis magnetic lens 300 has four through bores in each of the innermost magnetic cellular pillars, such as C3. Therefore, each paired cellular-type PD units form a sub-lens group comprising four sub-lenses inside each paired through holes.

Figure 2C:
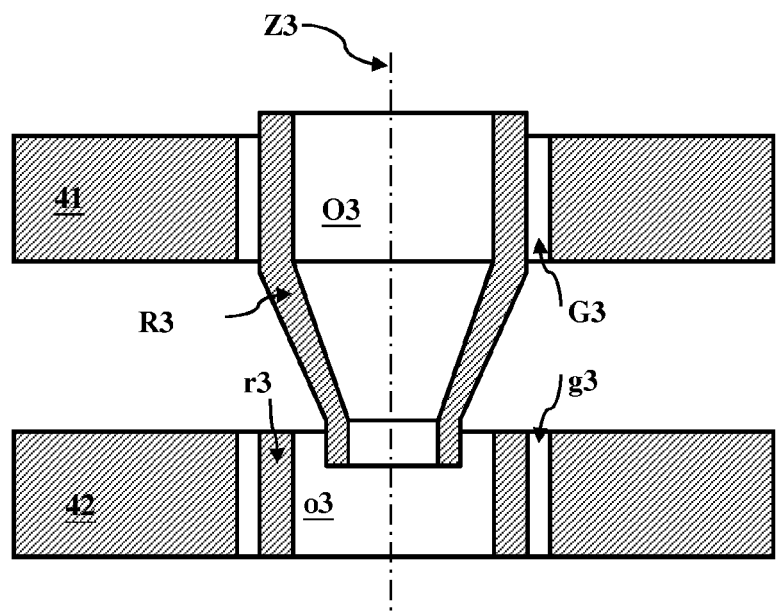
Figure 5A:
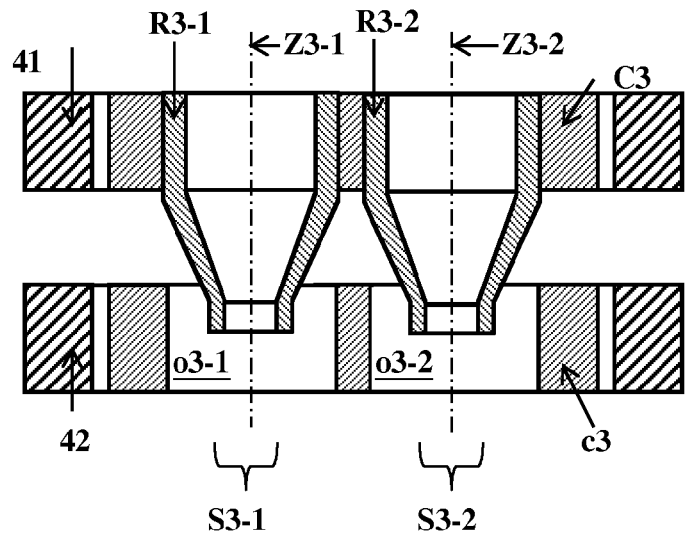
FIG. 5A is a schematic illustration of a sectional view of a multi-axis magnetic lens with a plurality of cellular-type PD units in accordance with another embodiment of the present invention.
Figure 5B:
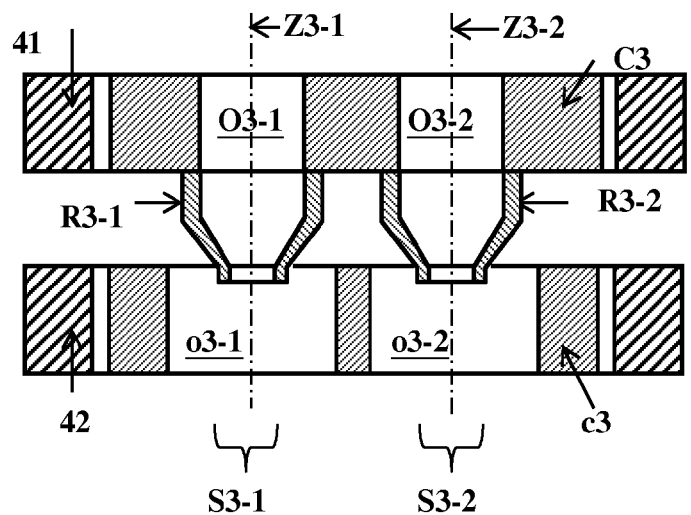
FIG. 5B is a schematic illustration of a sectional view of a multi-axis magnetic lens with a plurality of cellular-type PD units in accordance with another embodiment of the present invention.

For each sub-lens in FIG. 3C, such as S3-1, the non-axisymmetric transverse field components are effectively reduced inside paired through bores thereof, but not in the axial gap between the paired through bores and in the areas above and below the paired through bores. One way to eliminate the components in the axial gap, is to make the paired through bores overlay partially along the common central axis thereof, similarly to the sub-lens shown in FIG. 2C. To do so, one magnetic ring can be inserted inside or attached to one of the paired through bores and extended into the other of the paired through bores. FIG. 5A and FIG. 5B show two embodiments of the foregoing way and both take the sub-lenses S3-1 and S3-2 in FIG. 3C as examples. For the sake of clarity, the multi-axis magnetic lenses with such a variation are named as 400 and 410. Two magnetic rings R3-1 and R3-2 are respectively inserted inside two top bores O3-1 and O3-2 and adjacent to inner sidewalls of the bores O3-1 and O3-2 in FIG. 5A, and respectively configured below two top bores O3-1 and O3-2 in FIG. 5B. The narrow low ends of two magnetic rings R3-1 and R3-2 are respectively extended into two lower bores o3-1 and o3-2 in both FIGS. 5A and 5B. The inner holes of the magnetic rings R3-1 and R3-2 are respectively coaxial with two lower bores o3-1 and o3-2, and the two common central axes are Z3-1 and Z3-2. The magnetic rings R3-1 and R3-2 become two upper pole-pieces of two sub-lenses S3-1 and S3-2, instead of the upper magnetic cellular pillar C3. Two magnetic round-lens fields will be generated through the two non-magnetic gaps formed by two magnetic rings R3-1 and R3-2 and two lower bores o3-1 and o3-2, respectively along two common central axes Z3-1 and Z3-2.

Figure 5C:
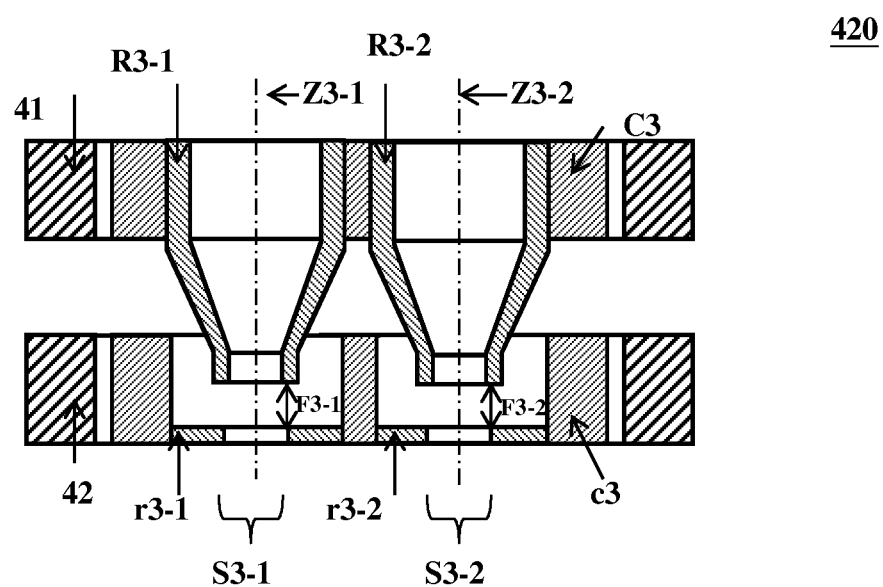
FIG. 5C is a schematic illustration of a sectional view of a multi-axis magnetic lens with a plurality of cellular-type PD units in accordance with another embodiment of the present invention.

FIG. 5C shows a way to further effectively control the size and/or orientation of the non-magnetic gaps shown in FIG. 5A, wherein two magnetic rings r3-1 and r3-2 are respectively inserted inside two lower bores o3-1 and o3-2. For the sake of clarity, the multi-axis magnetic lens with such a variation is named as 420. The central axes of the inner holes of the magnetic rings r3-1 and r3-2 are respectively coincident with the common central axes Z3-1 and Z3-2. Although the two non-magnetic gaps F3-1 and F3-2 are configured to be axial in FIG. 5C, the gaps can be any other orientations. The magnetic rings R3-1 and r3-1 become upper and lower pole-pieces of sub-lens S3-1 and the magnetic rings R3-2 and r3-2 become upper and lower pole-pieces of sub-lens S3-2, instead of the upper and lower magnetic cellular pillar C3 and c3.

Figure 6A:
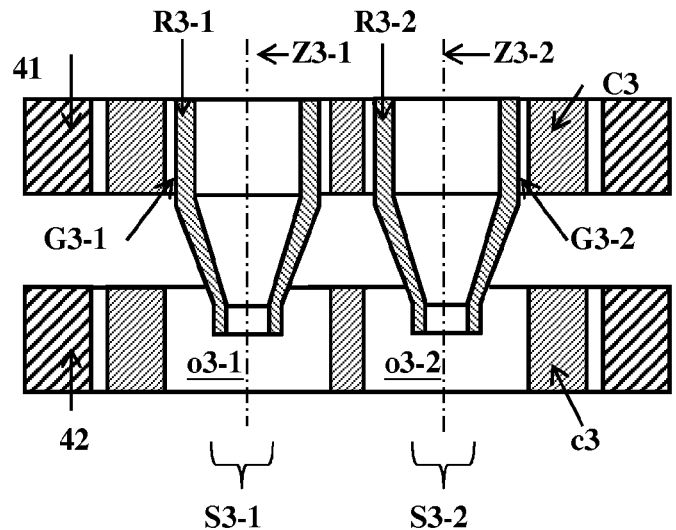
FIG. 6A is a schematic illustration of a sectional view of a multi-axis magnetic lens with a plurality of cellular-type PD units in accordance with another embodiment of the present invention.
Figure 6B:
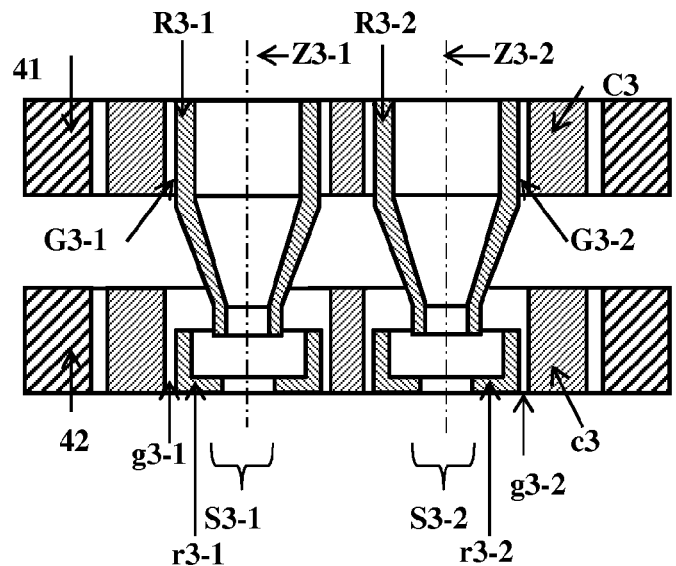
FIG. 6B is a schematic illustration of a sectional view of a multi-axis magnetic lens with a plurality of cellular-type PD units in accordance with another embodiment of the present invention.

For each sub-lens in FIG. 3C, such as S3-1, to further effectively reduce the non-axisymmetric transverse field components both inside paired through bores thereof and in the axial gap between the paired through bores, a first-type or second-type or hybrid-type PD unit can be inserted inside each through bore. The inserted unit can be configured to have layers as fewer as possible so that it is not necessary to obviously enlarge the radial dimensions of the bore. FIG. 6A and FIG. 6B show two embodiments of the foregoing way, which takes the sub-lenses S3-1 and S3-2 in FIG. 3C as examples. In FIG. 6A, two magnetic rings R3-1 and R3-2 are respectively inserted inside two top bores O3-1 and O3-2 with two radial gaps G3-1 and G3-2, and the narrow low ends thereof are respectively extended into two lower bores o3-1 and o3-2. The inner holes of the magnetic rings R3-1 and R3-2 are respectively coaxial with two lower bores o3-1 and o3-2, and the two common central axes are Z3-1 and Z3-2. The radial gaps G3-1 and G3-2 can be vacuum or filled with non-magnetic material or weakly-magnetic material having permeability much smaller than that of the adjacent magnetic rings R3-1 and R3-2 and the upper magnetic cellular pillar C3. The magnetic rings R3-1 and R3-2 become two upper pole-pieces of two sub-lenses S3-1 and S3-2, instead of the upper magnetic cellular pillar C3. Two magnetic round-lens fields will be generated through the two non-magnetic gaps formed by two magnetic rings R3-1 and R3-2 and two lower bores o3-1 and o3-2, respectively along two common central axes Z3-1 and Z3-2. For the sake of clarity, the multi-axis magnetic lens with such a variation is named as 500.

Furthermore in FIG. 6B, two magnetic rings r3-1 and r3-2 are respectively inserted inside two lower bores o3-1 and o3-2 with two radial gaps g3-1 and g3-2. The radial gaps g3-1 and g3-2 can be vacuum or filled with non-magnetic material or weakly-magnetic material having permeability much smaller than that of the adjacent magnetic rings r3-1 and r3-2 and the lower magnetic cellular pillar c3. For the magnetic rings r3-1 and r3-2, the inner holes thereof have central axes respectively coincident with the common central axes Z3-1 and Z3-2, and the upper ends thereof cover the lower ends of the magnetic rings R3-1 and R3-2. The magnetic rings R3-1 and r3-1 become upper and lower pole-pieces of sub-lens S3-1 and the magnetic rings R3-2 and r3-2 become upper and lower pole-pieces of sub-lens S3-2, instead of the upper and lower magnetic cellular pillar C3 and c3. Although the non-magnetic gaps between the upper and lower pole-pieces of sub-lenses S3-1 and S3-2 respectively are configured to be axial in FIG. 6B, the gaps can be any other orientations. For the sake of clarity, the multi-axis magnetic lens with such a variation is named as 510.

Figure 7:
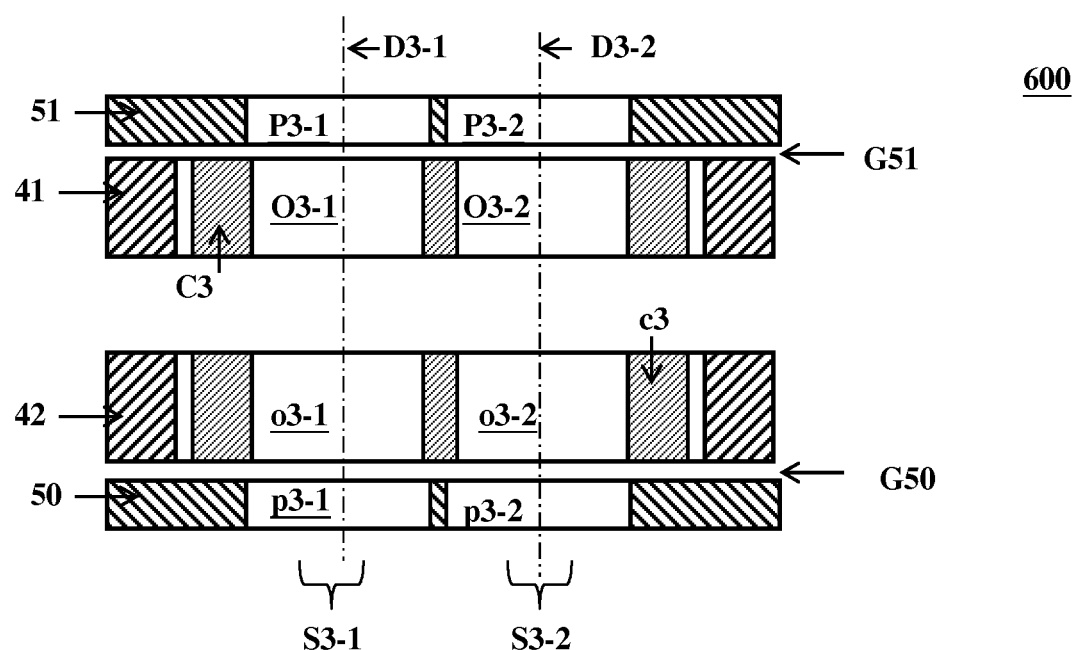
FIG. 7 is a schematic illustration of a sectional view of a multi-axis magnetic lens in accordance with another embodiment of the present invention

For each sub-lens in FIG. 3C, such as S3-1, to effectively reduce the non-axisymmetric transverse field components in the areas above the upper bore O3-1 and below the lower bore o3-1, two magnetic shielding tubes can be put in the areas respectively. In addition, two magnetic shielding plates with a plurality of through openings can be put respectively above and below the magnetic conductor plates 41 and 42, instead of putting two magnetic shielding tubes there for each sub-lens. Each bore of each sub-lens is aligned with one through opening. FIG. 7 shows one embodiment of such two magnetic shielding plates, which takes the sub-lenses S3-1 and S3-2 in FIG. 3C as examples. For the sake of clarity, the multi-axis magnetic lens with such a variation is named as 600. In FIG. 7, two magnetic shielding plates 50 and 51 with a plurality of through openings sandwich the magnetic conductor plates 41 and 42 with two axial gaps G50 and G51. Two through openings P3-1 and P3-2 in the upper plate 51 are aligned with two upper bores O3-1 and O3-2, and two through opening p3-1 and p3-2 in the lower plate 50 are aligned with two lower bores o3-1 and o3-2.

Figure 8A:
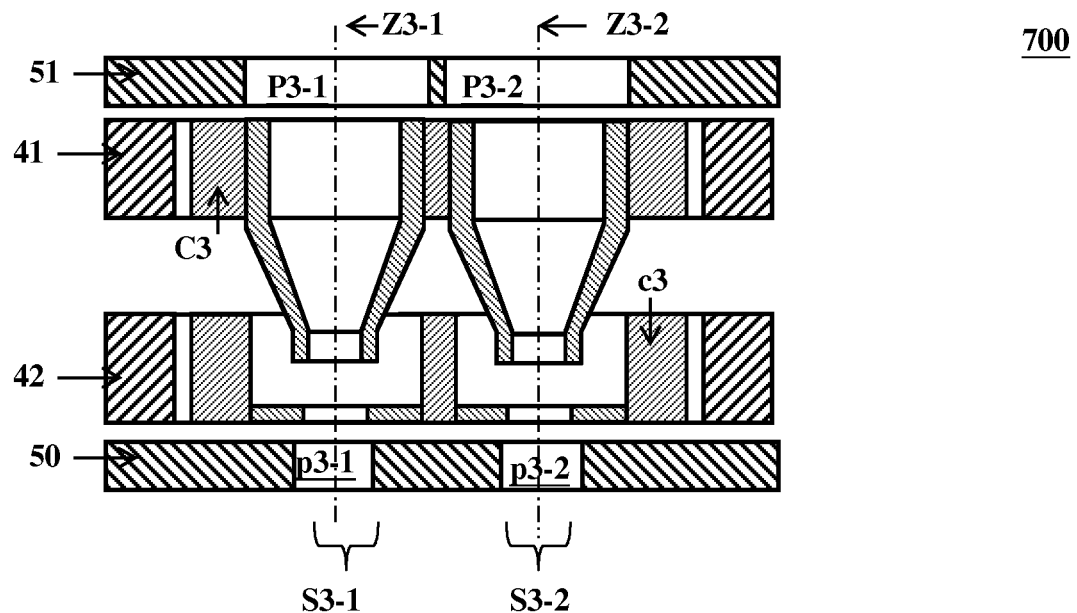
FIG. 8A is a schematic illustration of a sectional view of a multi-axis magnetic lens in accordance with another embodiment of the present invention.

All the foregoing ways can be combined to fully improve the performance of each sub-lens in FIG. 3C. FIG. 8A show one embodiment of a multi-axis magnetic lens with the ways shown in FIGS. 5C and 7, which also takes the sub-lenses S3-1 and S3-2 in FIG. 3C as examples. The multi-axis magnetic lens 700 in FIG. 8A has two magnetic shielding plates 50 and 51 respectively above and below the paired magnetic conductor plates 41 and 42, and comprises one magnetic ring inside each bore of each sub-lens. For the magnetic shielding plates 50 and 51, the left couple of the upper and lower through openings P3-1 and p3-1 and the right couple of the upper and lower through openings P3-1 and p3-1 are aligned with the optical axes of the sub-lenses S3-1 and S3-2 respectively.

Figure 9:
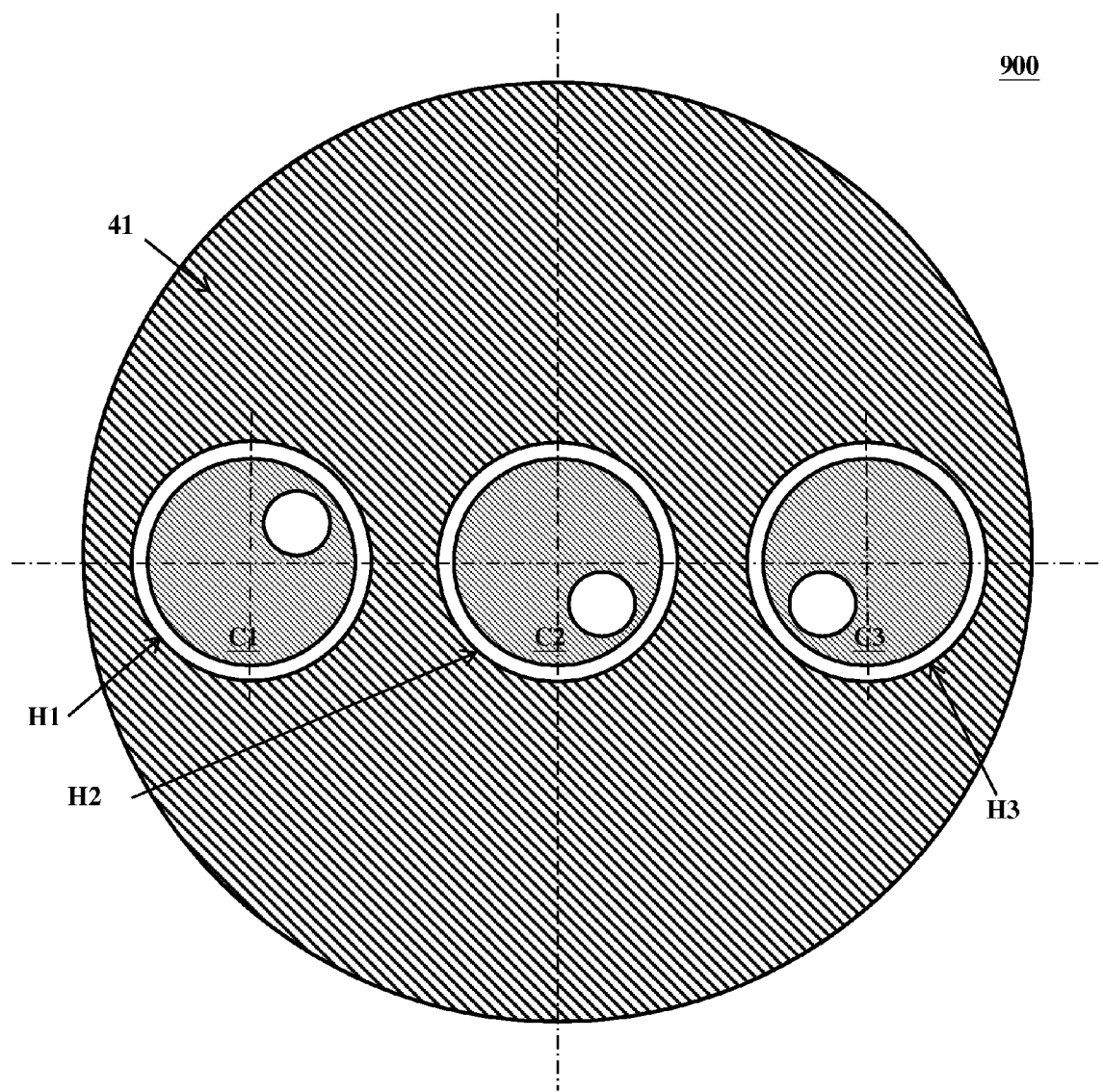
FIG. 9 is a schematic illustration of a top view of a multi-axis magnetic lens in accordance with another embodiment of the present invention.

For the numbers of bore in any magnetic pillar, a particular example is only one. Please refer to FIG. 9, again there are three magnetic pillars C1, C2, and C3, while only one bore for each magnetic pillars C1, C2, and C3. In this invention, position of any bore does not need to be located at center of any magnetic pillar. In FIG. 9, three locations of bores are shown for reference.

Figure 8B:
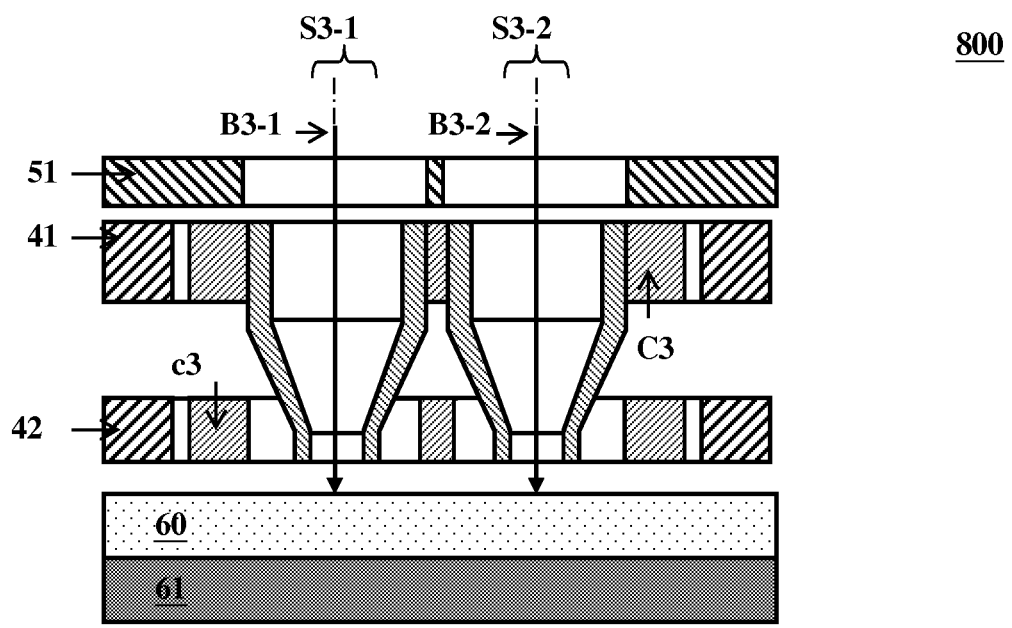
FIG. 8B is a schematic illustration of a sectional view of a multi-axis magnetic immersion objective lens in accordance with another embodiment of the present invention.

Every foregoing multi-axis magnetic lens is configured for general applications, which can be a multi-axis condenser lens, transfer lens or objective lens. It may have a simpler configuration for some special cases, such as a multi-axis magnetic immersion objective lens. FIG. 8B shows one embodiment of a multi-axis magnetic immersion objective lens with the ways shown in FIGS. 5A and 7, which takes the sub-lenses S3-1 and S3-2 in FIG. 3C as examples and supposes a specimen 60 on a specimen stage 61 below the paired magnetic conductor plates 41 and 42. Compared with FIG. 7, the multi-axis magnetic immersion objective lens 800 in FIG. 8B does not employ the magnetic shielding plate 50 below the paired magnetic conductor plates 41 and 42, but simply is located as close as possible to the specimen so as to reduce the influence of the non-axisymmetric transverse field components in the area below the paired magnetic conductor plates 41 and 42. In addition, to obtain a stronger magnetic field immersion on the specimen surface, the narrow lower ends of the magnetic rings R3-1 and R3-2 are further extended to approach the lower surface of the lower magnetic conductor plate 42.

In summary this invention provides more types of multi-axis magnetic lens based on the permeability-discontinuity fundamental which is proposed and employed in U.S. Pat. No. 8,003,953 and the cross-reference. A multi-axis magnetic lens of the types can accommodate more sub-lenses and are easier in manufacturing than before. At first, a cellular-type PD unit is proposed, which employs a magnetic cellular layer with more than one through bores as the innermost layer thereof. Next, a plurality of paired cellular-type PD units is used to configure a multi-axis magnetic lens of the first type, wherein each paired cellular-type units are inserted inside one paired through holes of the lens so that more than one sub-lenses can be formed therein. Then, several ways are provided for flexibly improving the performance of a multi-axis magnetic lens of the first type, for example inserting one magnetic ring or one PD unit inside each bore or only one of each paired through bores or putting two magnetic shielding plates with a plurality of through openings above and/or below the pair of magnetic conductor plates. The ways can be used individually or combined, and each corresponding variation results in another type of multi-axis magnetic lens.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multi-axis magnetic lens, comprising:
   a pair of parallel magnetic conductor plates with a plurality of through holes in pairs therein, the pair of parallel magnetic conductor plates including an upper plate and a lower plate, wherein for each paired through holes, an upper through hole in the upper plate is aligned with a corresponding lower through hole in the lower plate;
   a plurality of magnetic cellular pillars in pairs inside the plurality of through holes with a plurality of first radial gaps in pairs respectively, each pair of magnetic cellular pillars forming an axial gap therebetween and having a plurality of through bores in pairs, wherein for each paired first radial gaps formed by each paired magnetic cellular pillars inside each paired through holes, a first upper radial gap is between an inner sidewall of the upper through hole and an outer sidewall of the upper magnetic cellular pillar inside the upper through hole, a first lower radial gap is between an inner sidewall of the lower through hole and an outer sidewall of the lower magnetic cellular pillar inside the lower through hole, wherein for each paired through bores inside said each paired magnetic cellular pillars, an upper through bore in the upper magnetic cellular pillar is aligned with a corresponding lower through bore in the lower magnetic cellular pillar,
   thereby forming a plurality of magnetic sub-lens group modules for focusing a plurality of charged particle beams respectively, wherein each magnetic sub-lens group comprises a plurality of magnetic sub-lenses, and paired upper and lower magnetic cellular pillars of each sub-lens group module respectively function as upper and lower pole-pieces of each sub-lens of said sub-lens group; and
   a common excitation coil located between the pair of parallel magnetic conductor plates for providing magnetic flux to the plurality of magnetic sub-lens group modules.

2. The multi-axis magnetic lens according to claim 1, wherein each axial gap is vacuum or filled with non-magnetic material.

3. The multi-axis magnetic lens according to claim 2, wherein any first radial gap can be vacuum, or filled with non-magnetic or weakly-magnetic material.

4. The multi-axis magnetic lens according to claim 2, wherein any first radial gap can comprise an annular multilayer therein, and said annular multilayer comprises non-magnetic or weakly-magnetic annular layers and magnetic annular layers in alternate arrangement.

5. The multi-axis magnetic lens according to claim 3, further comprising a plurality of first magnetic rings, wherein each first magnetic ring has an end adjacent to or inside one of said each paired through bores.

6. The multi-axis magnetic lens according to claim 5, further comprising a plurality of second magnetic rings, wherein each second magnetic ring has an end adjacent to or inside the other of said each paired through bores.

7. The multi-axis magnetic lens according to claim 3, further comprising a plurality of first magnetic rings, wherein each first magnetic ring is inserted inside one of said each paired through bores with a second radial gap therebetween.

8. The multi-axis magnetic lens according to claim 7, wherein said second radial gap can be vacuum, or filled with non-magnetic or weakly-magnetic material.

9. The multi-axis magnetic lens according to claim 7, wherein said second radial gap can comprise an annular multilayer therein, and said annular multilayer comprises non-magnetic or weakly-magnetic annular layers and magnetic annular layers in alternate arrangement.

10. The multi-axis magnetic lens according to claim 7, further comprising a plurality of second magnetic rings, wherein each second magnetic ring is inserted inside the other of said each paired through bores with a third radial gap therebetween.

11. The multi-axis magnetic lens according to claim 10, wherein said second and third radial gaps can respectively be vacuum, or filled with non-magnetic or weakly-magnetic material.

12. The multi-axis magnetic lens according to claim 10, wherein said second and third radial gaps can respectively comprise an annular multilayer therein, and said annular multilayer comprises non-magnetic or weakly-magnetic annular layers and magnetic annular layers in alternate arrangement.

13. The multi-axis magnetic lens according to claim 1, further comprising at least one first magnetic shielding plate located on one side of the pair of magnetic conductor plates and respectively having a plurality of first through openings, wherein said each paired through bores are aligned with one of said first through openings of said each first magnetic shielding plate.

14. The multi-axis magnetic lens according to claim 13, further comprising at least one second magnetic shielding plate located the other side of the pair of magnetic conductor plates and respectively having a plurality of second through openings, wherein said each paired through bores are aligned with one of said second through openings of said each second magnetic shielding plate.

15. The multi-axis magnetic lens according to claim 1, wherein said each paired through bores are circular.

16. A permeability-discontinuity unit, comprising:
    one magnetic cellular layer; and
    at least one non-magnetic or weakly-magnetic annular layer outside said magnetic cellular layer,
    wherein permeability of each weakly-magnetic annular layer is much smaller than that of said magnetic cellular layer.

17. The permeability-discontinuity unit according to claim 16, wherein any non-magnetic or weakly-magnetic annular layer can further comprise more than one non-magnetic or weakly-magnetic sub-layers.

18. A permeability-discontinuity unit, comprising:
one magnetic cellular layer;
at least one magnetic annular layer; and
at least one non-magnetic or weakly-magnetic annular layer,
wherein one magnetic annular layer is immediately enclosed by one non-magnetic or weakly-magnetic annular layer and/or immediately encloses one non-magnetic or weakly-magnetic annular layer, the innermost annular layer encloses said magnetic cellular layer, and permeability of each weakly-magnetic annular layer is much smaller than that of said magnetic cellular layer and magnetic annular layers.

19. The permeability-discontinuity unit according to claim 18, wherein any non-magnetic or weakly-magnetic annular layer can further comprise more than one non-magnetic or weakly-magnetic sub-layers and any magnetic layer can further comprise more than one magnetic sub-layers.

20. A magnetic shielding device for a multi-axis magnetic lens, comprising:
at least one first magnetic shielding plate respectively having a plurality of first through openings and on one side of said multi-axis magnetic lens, wherein an optical axis of each magnetic sub-lens of said multi-axis magnetic lens is aligned with one of said first through openings of said each first magnetic shielding plate,
wherein all said first magnetic shielding plates are configured to make magnetic flux leaking out of said multi-axis magnetic lens vanish away rapidly outside the magnetic shielding device.

21. The magnetic shielding device according to claim 20, further comprising at least one second magnetic shielding plate respectively having a plurality of second through openings and on the other side of said multi-axis magnetic lens, wherein said optical axis of said each magnetic sub-lens of said multi-axis magnetic lens is aligned with one of said second through openings of said each second magnetic shielding plate,
wherein all said second magnetic shielding plates are configured to make magnetic flux leaking out of the multi-axis magnetic lens vanish away rapidly outside the magnetic shielding device.

22. The magnetic shielding device according to claim 20, wherein each of said first magnetic shielding plates can be kept gaps from the others and the multi-axis magnetic lens so as to make magnetic flux leaking out of the multi-axis magnetic lens vanish away more rapidly outside the magnetic shielding device.

23. The magnetic shielding device according to claim 21, wherein each of said first and second magnetic shielding plates can be kept gaps from the others and the multi-axis magnetic lens so as to make magnetic flux leaking out of the multi-axis magnetic lens vanish away more rapidly outside the magnetic shielding device.

24. A multi-axis magnetic lens, comprising:
a pair of parallel magnetic conductor plates with a plurality of through holes in pairs therein, the pair of parallel magnetic conductor plates including an upper plate and a lower plate, wherein for each paired through holes, an upper through hole in the upper plate is aligned with a corresponding lower through hole in the lower plate;
a plurality of magnetic pillars in pairs inside the plurality of through holes with a plurality of first radial gaps in pairs respectively, each pair of magnetic pillars forming an axial gap therebetween and having a pair of through bores, wherein for each paired first radial gaps formed by each paired magnetic pillars inside each paired through holes, a first upper radial gap is between an inner sidewall of the upper through hole and an outer sidewall of the upper magnetic pillar inside the upper through hole, a first lower radial gap is between an inner sidewall of the lower through hole and an outer sidewall of the lower magnetic pillar inside the lower through hole, wherein for one paired through bores inside said each paired magnetic pillars, an upper through bore in the upper magnetic pillar is aligned with a lower through bore in the lower magnetic pillar and said upper through bore is off from a center of said upper magnetic pillar,
thereby forming a plurality of magnetic sub-lens modules for focusing a plurality of charged particle beams respectively, wherein paired upper and lower magnetic pillars of each sub-lens module respectively function as upper and lower pole-pieces of said sub-lens; and
a common excitation coil located between the pair of parallel magnetic conductor plates for providing magnetic flux to the plurality of magnetic sub-lens modules.

25. The multi-axis magnetic lens according to claim 24, wherein each axial gap is vacuum or filled with non-magnetic material.

26. The multi-axis magnetic lens according to claim 25, wherein any first radial gap can be vacuum, or filled with non-magnetic or weakly-magnetic material.

27. The multi-axis magnetic lens according to claim 25, wherein any first radial gap can comprise an annular multi-layer therein, and said annular multilayer comprises non-magnetic or weakly-magnetic annular layers and magnetic annular layers in alternate arrangement.

28. The multi-axis magnetic lens according to claim 27, wherein any non-magnetic or weakly-magnetic annular layer can further comprise more than one non-magnetic or weakly-magnetic sub-layers and any magnetic layer can further comprise more than one magnetic sub-layers.

29. The multi-axis magnetic lens according to claim 24, wherein said each paired through bores are circular.

* * * * *